(12) United States Patent
Andry et al.

(10) Patent No.: US 8,564,113 B2
(45) Date of Patent: Oct. 22, 2013

(54) ELECTROSTATIC CHUCKING OF AN INSULATOR HANDLE SUBSTRATE

(75) Inventors: Paul S. Andry, Yorktown Heights, NY (US); Edward C. Cooney, III, Jericho, VT (US); Edmund J. Sprogis, Underhill, VT (US); Anthony K. Stamper, Williston, VT (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/444,193

(22) Filed: Apr. 11, 2012

(65) Prior Publication Data
US 2012/0193790 A1 Aug. 2, 2012

Related U.S. Application Data

(62) Division of application No. 12/540,510, filed on Aug. 13, 2009, now Pat. No. 8,242,591.

(51) Int. Cl.
H01L 23/488 (2006.01)
(52) U.S. Cl.
USPC ............ 257/692; 257/723; 257/E21.599; 257/E23.023; 257/E21.499; 438/121; 438/118
(58) Field of Classification Search
USPC ............ 257/692, 723, E21.599, E21.499, 257/E23.023
See application file for complete search history.

(56) References Cited

U.S. PATENT DOCUMENTS

| | | | |
|---|---|---|---|
| 6,075,712 A * | 6/2000 | McMahon | 361/783 |
| 6,133,112 A | 10/2000 | Iwane et al. | |
| 6,506,620 B1 | 1/2003 | Scharf et al. | |
| 6,787,435 B2 | 9/2004 | Gibb et al. | |
| 7,190,005 B2 | 3/2007 | Gibb et al. | |
| 7,226,812 B2 | 6/2007 | Lu et al. | |
| 2004/0235264 A1 | 11/2004 | Forbes | |
| 2006/0205180 A1* | 9/2006 | Henley et al. | 438/458 |
| 2006/0281309 A1 | 12/2006 | Trezza | |
| 2007/0138562 A1 | 6/2007 | Trezza | |
| 2007/0161235 A1 | 7/2007 | Trezza | |
| 2007/0284602 A1 | 12/2007 | Chitnis et al. | |
| 2008/0042140 A1 | 2/2008 | Alam et al. | |
| 2008/0237762 A1 | 10/2008 | Swain et al. | |

* cited by examiner

*Primary Examiner* — Mamadou Diallo
(74) *Attorney, Agent, or Firm* — Scully, Scott, Murphy & Presser, P.C.; Vazken Alexanian

(57) ABSTRACT

A back of a dielectric transparent handle substrate is coated with a blanket conductive film or a mesh of conductive wires. A semiconductor substrate is attached to the transparent handle substrate employing an adhesive layer. The semiconductor substrate is thinned in the bonded structure to form a stack of the transparent handle substrate and the semiconductor interposer. The thinned bonded structure may be loaded into a processing chamber and electrostatically chucked employing the blanket conductive film or the mesh of conductive wires. The semiconductor interposer may be bonded to a semiconductor chip or a packaging substrate employing C4 bonding or intermetallic alloy bonding. Illumination of ultraviolet radiation to the adhesive layer is enabled, for example, by removal of the blanket conductive film or through the mesh so that the transparent handle substrate may be detached. The semiconductor interposer may then be bonded to a packaging substrate or a semiconductor chip.

18 Claims, 13 Drawing Sheets

ELECTROSTATIC CHUCKING OF AN INSULATOR HANDLE SUBSTRATE

CROSS REFERENCE TO RELATED APPLICATION

This application is a divisional of U.S. patent application Ser. No. 12/540,510, filed Aug. 13, 2009 the entire content and disclosure of which is incorporated herein by reference.

BACKGROUND

The present invention relates to methods of manufacturing semiconductor structures, and particularly to methods of electrostatically chucking an insulator handle substrate, and structures for effecting the same.

Semiconductor interposers may be employed between a semiconductor chip and packaging substrate to provide redistribution of electrical nodes on the surface of the semiconductor chip. For example, a semiconductor chip having a non-standard pitch among Controlled Collapse Chip Connection (C4) pads may be attached to a packaging substrate having a standard pitch by placing a semiconductor interposer including a first set of C4 pads having the non-standard pitch on one side and a second set of C4 pads having the standard pitch on the other side.

BRIEF SUMMARY

The present invention provides a method of electrostatically chucking a dielectric handle substrate in a process chamber.

In the present invention, a back of a dielectric transparent handle substrate is coated with a blanket conductive film or a mesh of conductive wires. A semiconductor substrate sufficiently thick for mechanical handling and including a structure for a semiconductor interposer is attached to the transparent handle substrate employing an adhesive layer, which may be deactivated by ultraviolet (UV) radiation. The semiconductor substrate is thinned in the bonded structure to form a stack of the transparent handle substrate and the semiconductor interposer. The thinned bonded structure may be loaded into a processing chamber and electrostatically chucked employing the blanket conductive film or the mesh of conductive wires. The semiconductor interposer may be bonded to a semiconductor chip or a packaging substrate employing C4 bonding. Illumination of ultraviolet radiation to the adhesive layer is enabled, for example, by removal of the blanket conductive film or through the mesh so that the transparent handle substrate may be detached. The semiconductor interposer may then be bonded to a packaging substrate or a semiconductor chip.

According to an aspect of the present invention, a method of forming a semiconductor structure is provided, which comprises: forming a conductive material layer on a dielectric handle substrate; forming a bonded semiconductor structure by bonding a front surface of the dielectric handle substrate to a semiconductor interposer structure employing an adhesive layer, wherein the adhesive layer abuts the front surface of the dielectric handle substrate and a back surface of the semiconductor interposer structure; and electrostatically chucking the bonded semiconductor structure directly on an electrostatic chuck of a processing tool, wherein the dielectric handle substrate is placed in closer proximity to the electrostatic chuck than the semiconductor interposer structure.

According to another aspect of the present invention, a semiconductor structure is provided, which comprises: a bonded semiconductor structure including a dielectric handle substrate and a semiconductor interposer structure, wherein a front surface of the dielectric handle substrate is bonded to a back surface of a semiconductor interposer structure through an adhesive layer, wherein the semiconductor interposer structure includes metal interconnect structures electrically connected to first conductive pads located on the back surface of the semiconductor interposer structure, and wherein the adhesive layer abuts the front surface of the dielectric handle substrate and the back surface of the semiconductor interposer structure; and a conductive material layer vertically abutting a back surface of a dielectric handle substrate.

DETAILED DESCRIPTION

Figure 1:
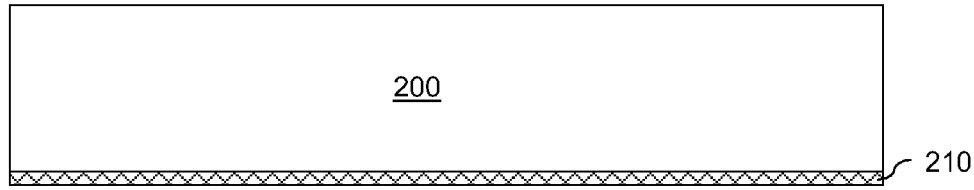
FIG. 1 is a vertical cross-sectional view of a dielectric handle substrate 200 with a conductive material layer 210 on a back surface according to a first embodiment of the present invention.

As stated above, the present invention relates to methods of electrostatically chucking an insulator handle substrate, and structures for effecting the same, which are now described in detail with accompanying figures. It is noted that like and corresponding elements mentioned herein and illustrated in the drawings are referred to by like reference numerals. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIG. 1, a dielectric handle substrate 200 employed in embodiments of the present invention is shown. The dielectric handle substrate 200 comprises a dielectric material, i.e., an insulator material, such as quartz, borosilicate glass, amorphous silicon oxide, aluminum oxide, or other transparent dielectric materials such as transition metal oxides having a wide band gap to allow transmission of ultraviolet radiation. The dielectric handle substrate 200 may also be transparent in the visible spectrum and/or in the infrared spectrum. The thickness of the dielectric handle substrate 200 may be from about 400 μm to about 1,200 although lesser and greater thicknesses are also contemplated herein.

According to a first embodiment of the present invention, a conductive material layer 210 is formed directly on a back surface of the dielectric handle substrate 200. As used herein, a "back surface" refers to a surface located on the bottom side of a structure in the drawings. Likewise, a "front surface" refers to a surface located on the top side of a structure in the drawings. The conductive material layer 210 may be a contiguous blanket conductive material layer without a hole therein, and may cover the entirety of the back surface of the dielectric handle substrate 200. The conductive material layer 210 may comprise a doped semiconductor material or a metallic material. The conductive material layer 210 has a resistivity less than $1.0 \times 10^{-2}$ Ω-cm, and preferably less than $1.0 \times 10^{-4}$ Ω-cm. Exemplary conductive materials that may be employed for the conductive material layer 210 include, but are not limited to, W, Ta, Ti, WN, TaN, TiN, Cu, Al, and Cu—Al alloys. The thickness of the conductive material layer 210 may be from 2 nm to 200 nm, and preferably from 50 nm to 500 nm, although lesser and greater thicknesses are also contemplated herein. The sheet resistance of the conductive material layer 210 may be from 0.1Ω/□ to 100Ω/□, and preferably from 1.0Ω/□ to 30Ω/□, although lesser and greater values for the sheet resistance are also contemplated herein.

Figure 2:
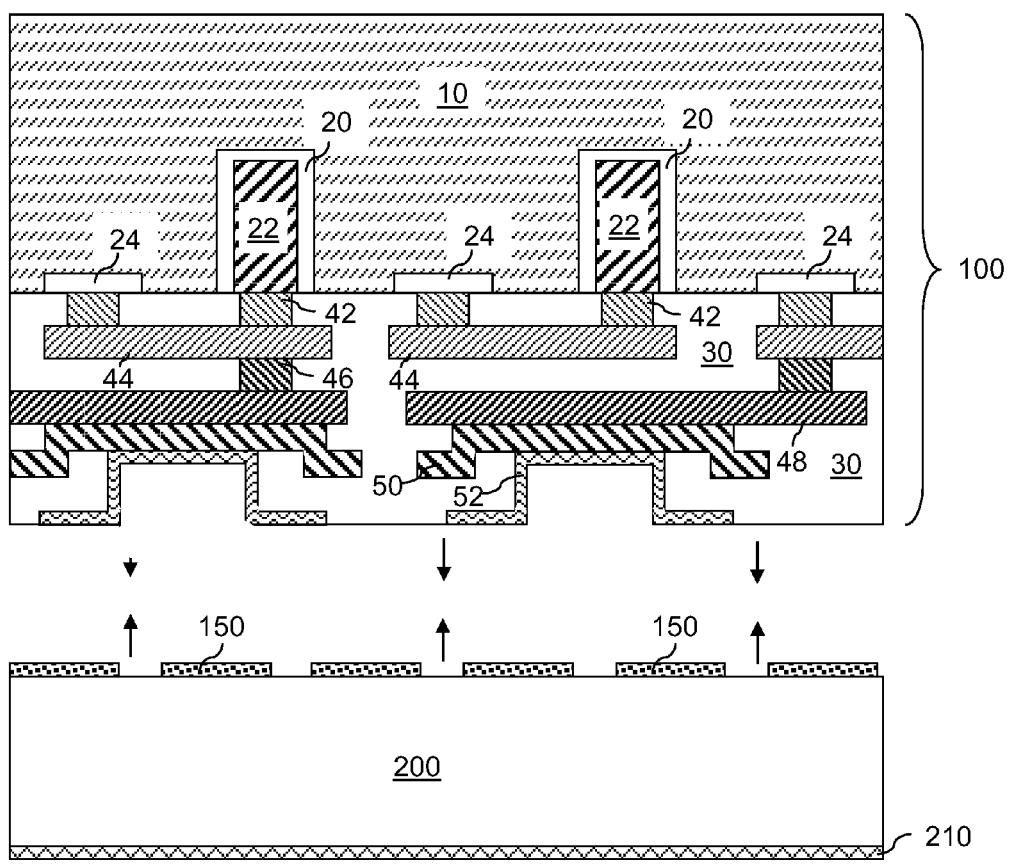
FIG. 2 is a vertical cross-sectional view of a semiconductor interposer structure 100 and the dielectric handle substrate 200 with an adhesive layer 150 therebetween according to the first embodiment of the present invention.

Referring to FIG. 2, a semiconductor interposer structure 100 is provided, which comprises a first semiconductor substrate 10, at least one dielectric material layer 30, and metal interconnect structures embedded in the at least one dielectric material layer 30. An array of conductive studs 22 is provided in the first semiconductor substrate 10. The conductive studs 22 are electrically connected to the metal interconnect structures. Typically, the conductive studs 22 are resistively connected to the metal interconnect structures. The conductive studs 22 are located in a lower portion of the first semiconductor substrate 10. The bottom surface of each conductive stud 22 may be substantially coplanar with a bottom surface of the first semiconductor layer 10. A dielectric stud liner 20 may be provided on each conductive stud 22 so that the array of the conductive studs 22 is electrically isolated from the first semiconductor substrate.

The first semiconductor substrate 10 comprises a semiconductor material. The semiconductor material for the first semiconductor substrate 10 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In some cases, the first semiconductor substrate 10 may be a single crystalline semiconductor substrate. While the present invention is described employing the first semiconductor substrate 10 comprising a semiconductor material, embodiments in which the first semiconductor substrate 10 is replaced with an insulator substrate or a substrate including conductive materials and an insulator coating on outer surfaces are explicitly contemplated herein. The thickness of the first semiconductor substrate 10 is sufficient to provide mechanical support to the semiconductor interposer structure 100, and is typically from 400 μm to 1,200 μm, although lesser and greater thicknesses area also contemplated herein.

The at least one dielectric material layer 30 comprises a dielectric material that is typically employed in BEOL interconnect structures. The dielectric materials that may be used for the at least one dielectric material layer 30 include, but are not limited to, silicon nitride, a silicate glass, an organosilicate glass (OSG) material, a SiCOH-based low-k material formed by chemical vapor deposition, a spin-on glass (SOG), or a spin-on low-k dielectric material such as SiLK™, etc. The silicate glass includes an undoped silicate glass (USG), borosilicate glass (BSG), phosphosilicate glass (PSG), fluorosilicate glass (FSG), borophosphosilicate glass (BPSG), etc. The dielectric material may be a low dielectric constant (low-k) material having a dielectric constant less than 3.0. The dielectric material may be non-porous or porous. The total thickness of the at least one dielectric material layer 30 may be from 1 μm to 50 μm and typically from 2 μm to 20 μm although lesser and greater thicknesses are also contemplated herein.

The metal interconnect structures may include multiple levels of metal structures. For example, the metal interconnect structures may include first-via-level metal vias 42, first-line-level metal lines 44, second-via-level metal vias 46, second-line-level metal lines 48, a third-line-level metal lines 50, and first conductive pads 52. The various metal structures (42, 44, 46, 48, 50, 52) comprise at least one metallic material such as Cu, W, Ti, Ta, WN, TiN, TaN, and/or Al. The first-via-level metal vias 42 vertically abut the conductive studs 22 embedded in the first semiconductor substrate 10. Dielectric isolation structures 24 may be provided on the bottom surface of the first semiconductor substrate 10 to provide electrical isolation between the first semiconductor substrate 10 and the first-via-level metal vias 42. The first-line-level metal lines 44 vertically abut the first-via-level metal vias 42. The second-via-level metal vias 46 vertically abut the first-line-level metal lines 44. The second-line-level metal lines 48 vertically abut the second-via-level metal vias 46. The third-line-level metal lines 50 vertically abut the second-line-level metal lines 48. The first conductive pads 52 vertically abut the third-line-level metal lines 50. The first conductive pads 52 vertically abut the third-line-level metal lines 50. The metal interconnect structures are embedded in the at least one dielectric material layer 30. The metal interconnect structures described herein are only for the purpose of providing an illustrative example. Any other metal interconnect structures having different numbers of metal line levels and/or metal via levels may be employed instead.

In one case, an adhesive layer 150 may be formed on the top surface of the dielectric handle substrate 200 on the opposite side of the conductive material layer 210. In another case, an adhesive layer 150 may be formed on the bottom surface of the semiconductor interposer structure, i.e., on the bottom surface of the at least one dielectric material layer 30. The adhesive layer 150 comprises a deactivatable adhesive material which provides adhesive strength prior to deactivation but substantially loses adhesive property upon deactivation. In one case, the deactivation mechanism may be exposure to ultraviolet light, i.e., the adhesive layer 150 comprises an ultraviolet (UV) deactivatable material having reduced adhesion strength upon exposure to ultraviolet radiation. For example, the adhesive material in the adhesive layer 150 may comprise an oligomer that loses cross-linkage upon exposure to ultraviolet (UV) light. Acrylic adhesive materials, which deactivates and significantly loses adhesive property upon exposure to ultraviolet light, may be employed as an ultraviolet sensitive material in the adhesive layer 150. Alternately, other deactivation mechanisms such as exposure to visible light or exposure to infrared radiation may be employed. The adhesive layer 150 may be formed as a single contiguous layer with, or without, holes, or it may be formed as a plurality of disjoined adhesive material portions. The thickness of the adhesive layer 150 may be from 0.5 μm to 100 μm, and typically 2 μm to 20 μm, although lesser and greater thicknesses are also contemplated herein. The semiconductor interposer structure 100 and the dielectric handle substrate 200 are brought together with the adhesive layer 150 therebetween.

Figure 3A:
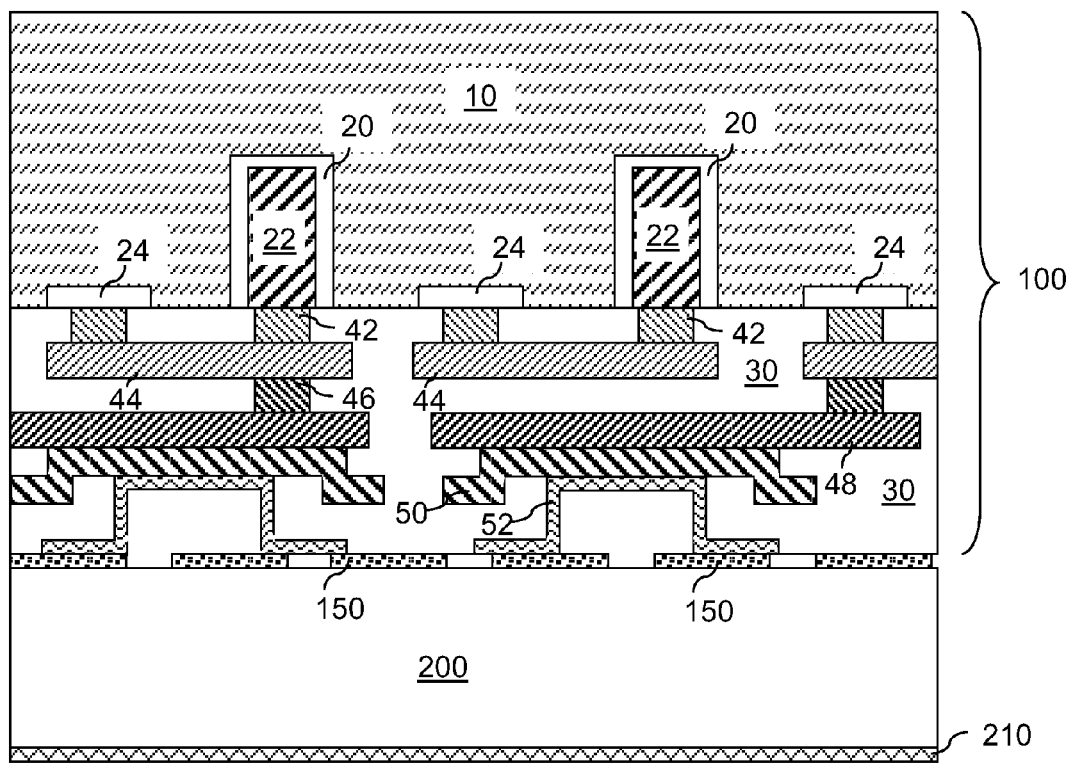
FIG. 3A is a vertical cross-sectional view of a bonded semiconductor structure including the semiconductor interposer structure 100 and the dielectric handle substrate according to the first embodiment of the present invention.
Figure 3B:
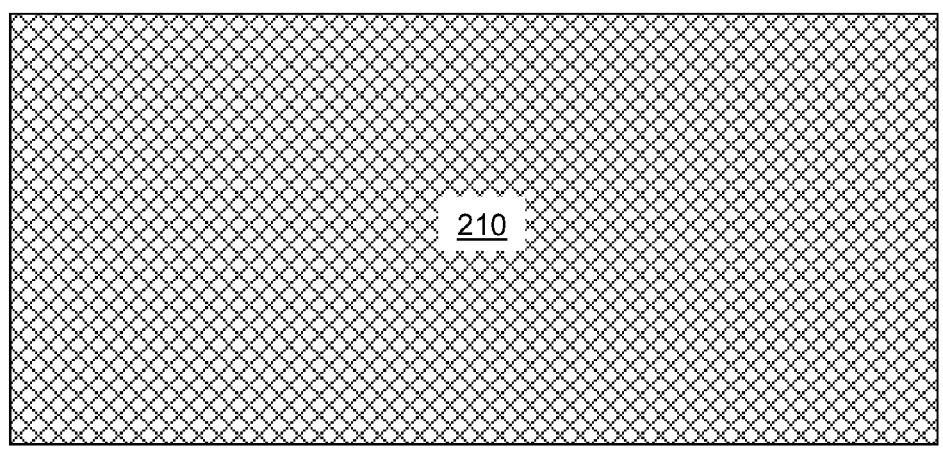
FIG. 3B is a bottom-up view of the bonded semiconductor structure (100, 150, 200, 210) according to the first embodiment of the present invention.

Referring to FIGS. 3A and 3B, temperature and/or pressure is applied to bond the semiconductor interposer structure 100 with the dielectric handle substrate 200 through the adhesive layer 150. FIG. 3A is a vertical cross-sectional view and FIG. 3B is a bottom-up view. A first exemplary bonded semiconductor structure including the semiconductor interposer structure 100, the adhesive layer 150, the dielectric handle substrate 200, and the conductive material layer 210 is shown. The adhesive layer 150 keeps the semiconductor interposer structure 100 fixed in location relative to the dielectric handle substrate 200 so that the first exemplary bonded semiconductor structure (100, 150, 200, 210) moves as a rigid body. The entirety of the back surface of the dielectric handle substrate 200 is covered by the conductive material layer, which is a blanket film of a conductive material.

Figure 4:
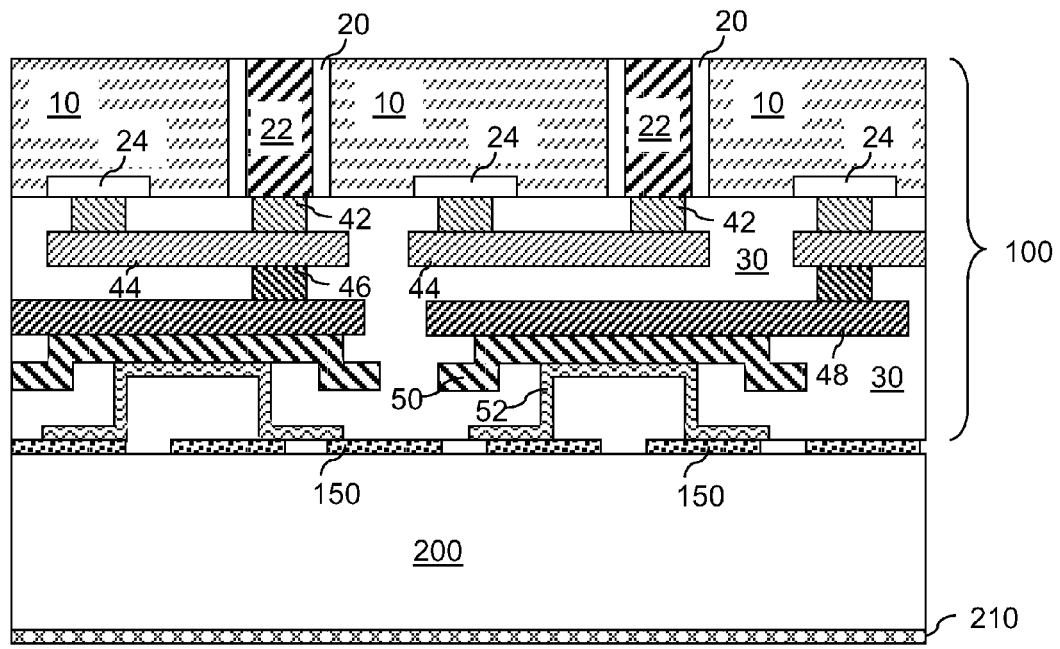
FIG. 4 is a vertical cross-sectional view of the bonded semiconductor structure after grinding of the front side of the semiconductor interposer structure 100 according to the first embodiment of the present invention.

Referring to FIG. 4, the front surface of the first semiconductor substrate 10 is recessed at least down to the top surfaces of the array of the conductive studs 22. The recessing of the top surface of the first semiconductor substrate 10 may be effected, for example, by grinding, chemical etching, chemical mechanical planarization, a dry etch, or a combination thereof. The dielectric stud liner 20 and/or the conductive studs 22 may be employed as an etch stop layer. After recessing, the front surface of the first semiconductor substrate 10 is substantially coplanar with top surfaces of the conductive studs 22. The thickness of the first semiconductor substrate 10 may be substantially the same as the height of the conductive studs 22, and may be from about 20 μm to about 300 μm, and typically from about 50 μm to about 150 μm, although lesser and greater thicknesses are also contemplated herein.

Figure 5:
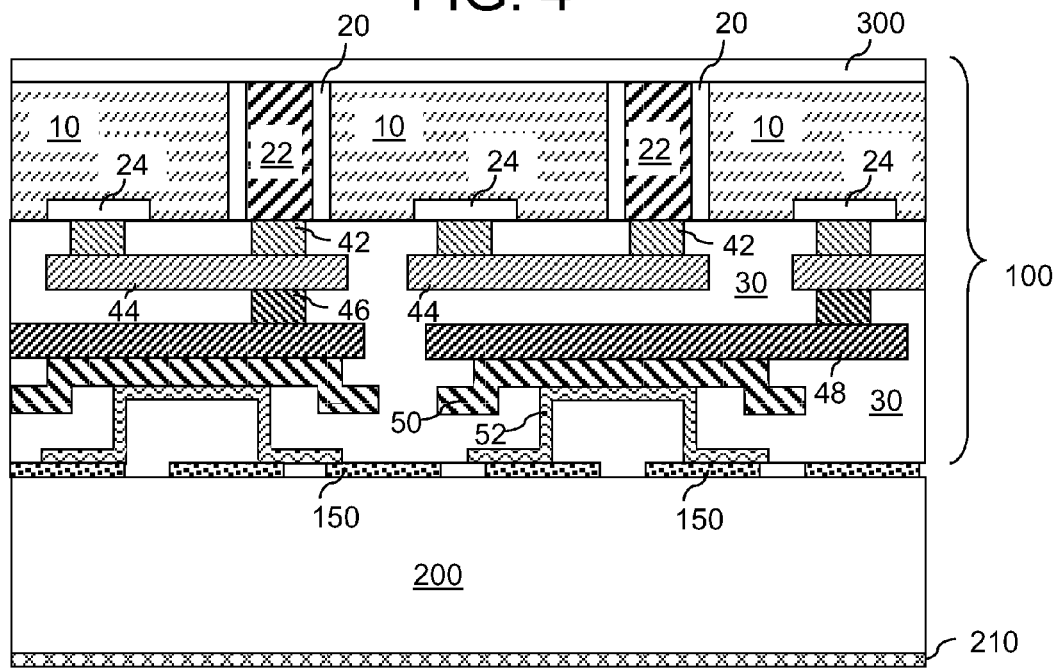
FIG. 5 is a vertical cross-sectional view of the bonded semiconductor structure after deposition of at least one material layer 300 according to the first embodiment of the present invention.
Figure 5A:
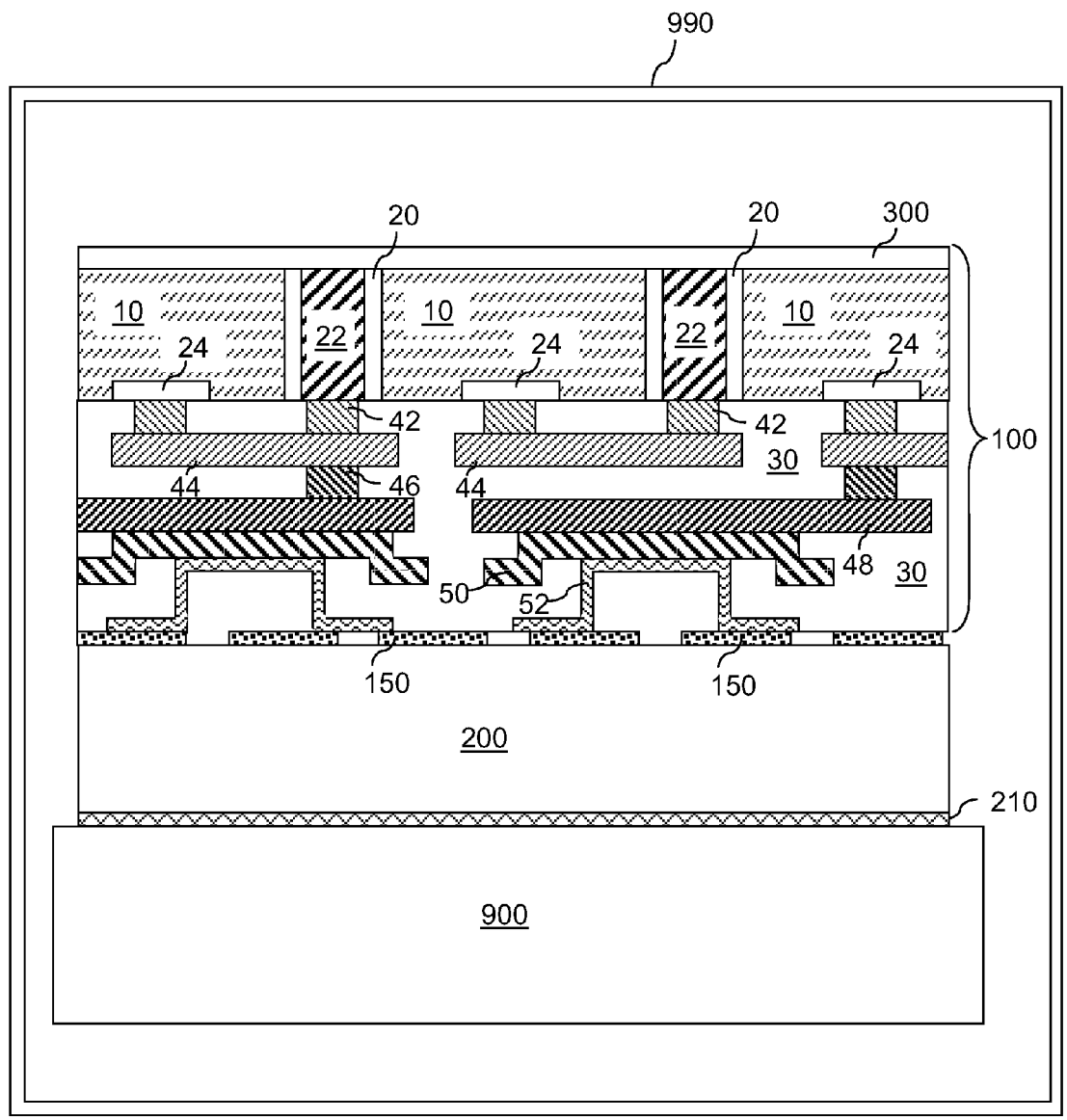
FIG. 5A is a vertical cross-sectional view of the bonded semiconductor structure of FIG. 5 as loaded onto an electrostatic chuck in a processing chamber.

Referring to FIG. 5, the first exemplary bonded semiconductor structure (100, 150, 200, 210) is loaded into a processing chamber for deposition of at least one material layer 300, which may be a dielectric material layer or a conductive material layer. The at least one material layer 200 may include a dielectric material layer that provides electrical isolation and/or passivation of the first semiconductor substrate 10 from other conductive structures to be subsequently formed over the first semiconductor substrate 10. Upon deposition on the front surface of the semiconductor interposer structure 100, the at least one material layer 300 is incorporated into the semiconductor interposer structure 100. In case electrostatic chucking of the first exemplary bonded semiconductor structure (100, 150, 200, 210) is needed, the conductive material layer 210 may be employed to provide electrical contact between the first exemplary bonded semiconductor structure (100, 150, 200, 210) and an electrostatic chuck 900 of the processing chamber 990 through a direct contact therebetween as illustrated in FIG. 5A.

The presence of the conductive material layer 210 enables electrostatic chucking of the first exemplary bonded semiconductor structure (100, 150, 200, 210) on an electrostatic chuck. If the conductive material layer 210 is absent on the back surface of the dielectric handle substrate 200, loading a structure including the dielectric handle substrate 200 into a process chamber would induce direct contact between the dielectric handle substrate 200 and the electrostatic chuck. Since the dielectric handle substrate 200 is not conductive, electrical charges may accumulate in the semiconductor interposer structure 100 in the absence of the conductive material layer 210, thereby causing arcing in the process chamber and inducing structural damages to the semiconductor interposer structure 200. By providing the conductive material layer 210, the first embodiment of the present invention prevents accumulation of electrical charges in the first exemplary bonded semiconductor structure (100, 150, 200, 210), and prevents arcing between the first exemplary bonded semiconductor structure (100, 150, 200, 210) and components of the processing chamber.

Figure 6:
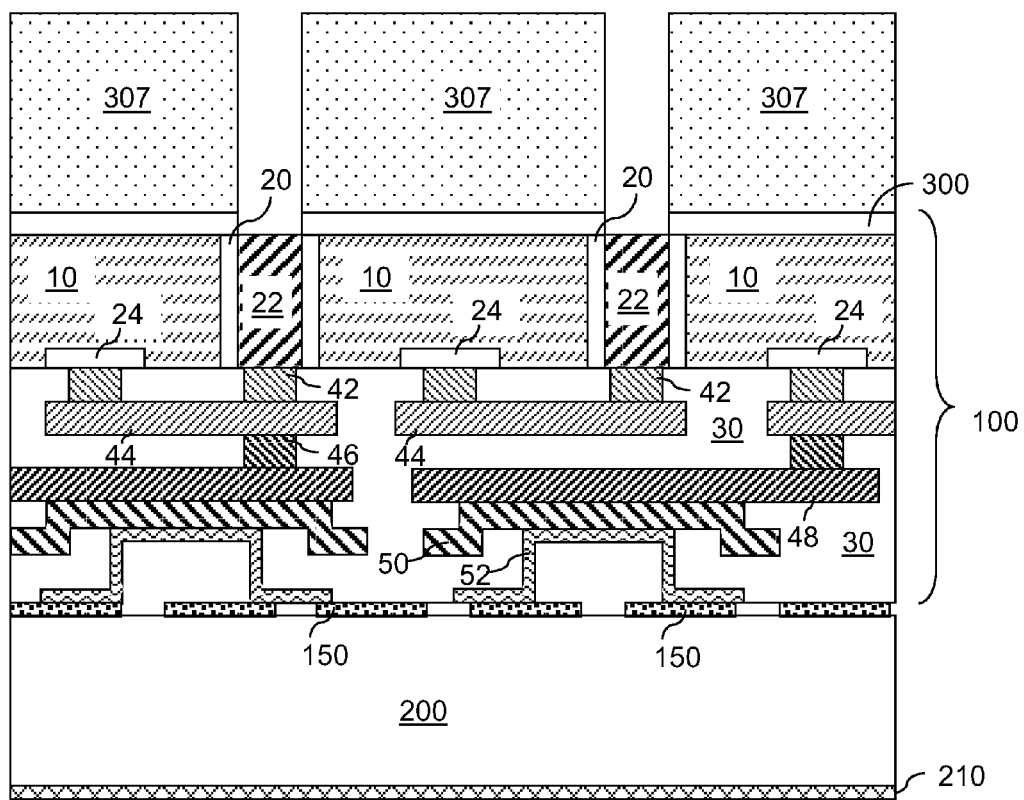
FIG. 6 is a vertical cross-sectional view of the bonded semiconductor structure after application and patterning of a photosensitive material layer 307 according to the first embodiment of the present invention.

Referring to FIG. 6, the at least one material layer 300 is lithographically patterned. Specifically, lithographic patterning of the at least one material layer 300 may be effected by applying a photoresist 307 to the top surface of the at least one material layer, lithographically patterning the photoresist 307, and transferring the pattern in the photoresist 307 into the at least one material layer 300 by an etch, which may be a wet etch or a dry etch. In case a dry etch is employed, the first exemplary bonded semiconductor structure (100, 150, 200, 210) may be loaded into another processing chamber and placed directly upon an electrostatic chuck. The first exemplary bonded semiconductor structure (100, 150, 200, 210) is then electrostatically chucked so that the first exemplary bonded semiconductor structure (100, 150, 200, 210) remains stationary in the processing chamber. The electrostatic chucking of the first exemplary bonded semiconductor structure (100, 150, 200, 210) is particularly useful during the dry etch, which may be an anisotropic reactive ion etch that employs electrical bias and/or radio frequency (RF) signal within the processing chamber. The photoresist 307 may be subsequently removed.

The at least one material layer 300 may include at least one dielectric material layer and/or at least one conductive material layer. Each of the at least one material layer 300 may be patterned individually, or may be patterned in combination with another of the at least one material layer 300. In one case, multiple deposition steps and multiple patterning steps may be employed to form additional metal interconnect structures (not shown). During each patterning step for any material layer of the at least one material layer 300, the conductive material layer 210 of the first exemplary bonded semiconductor structure (100, 150, 200, 210) may be employed to enable electrostatic chucking of the first exemplary bonded semiconductor structure (100, 150, 200, 210). At the end of the at least one patterning process, an array of conductive surfaces is exposed on the top surface of the first exemplary bonded semiconductor structure (100, 150, 200, 210). The array of conductive surfaces may be an array of the top surfaces of the conductive studs 22. Alternately, the array of conductive surfaces may be an array of conductive surfaces of the additional metal interconnect structures (not shown). The electrostatic chucking of the first exemplary bonded semiconductor structure (100, 150, 200, 210) protects the semiconductor interposer structure 100 during processing steps in which a direct current (DC) voltage bias or an alternating current (AC) bias is applied between the semiconductor interposer structure 100 and any component in the processing chamber.

Figure 7:
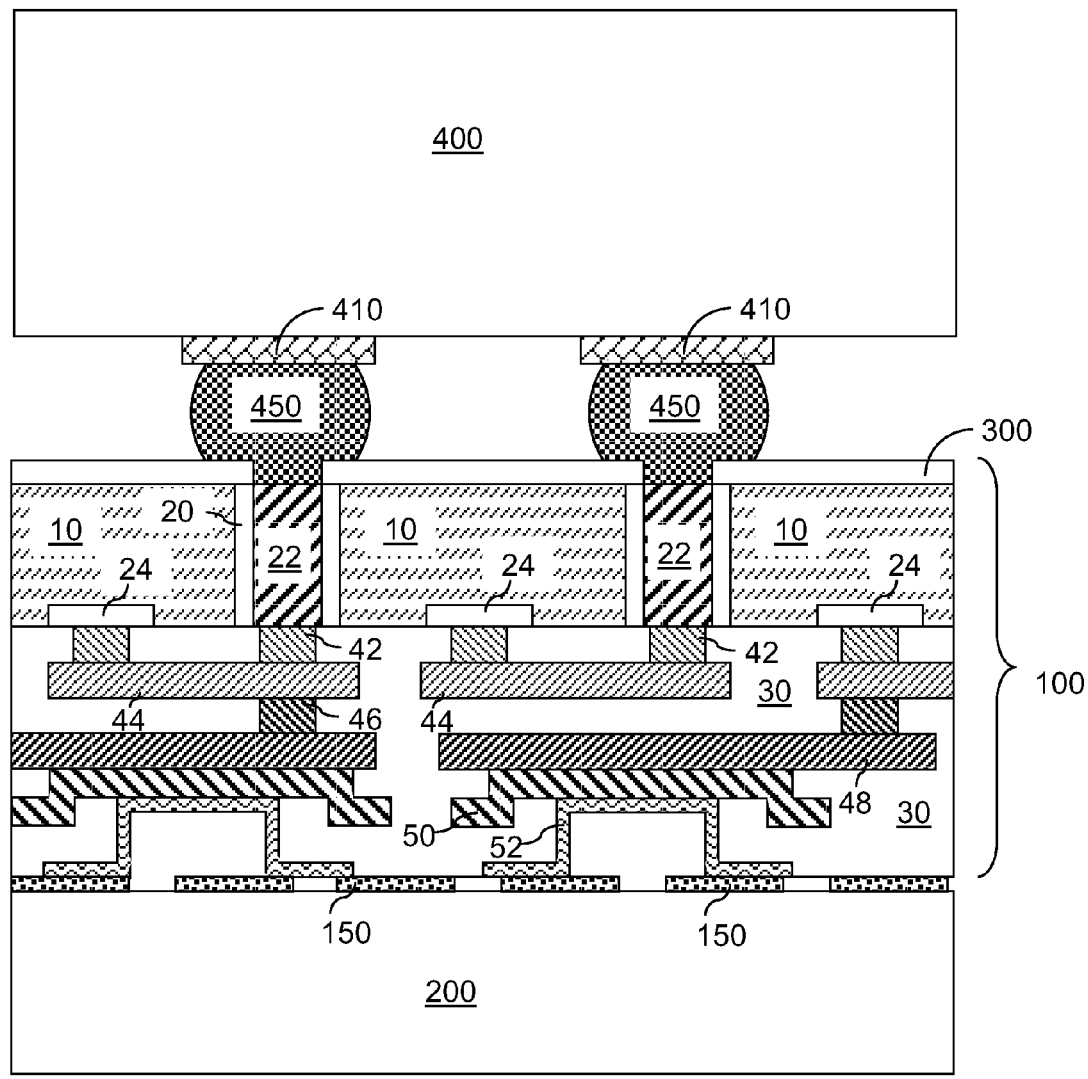
FIG. 7 is a vertical cross-sectional view of a first composite structure after attaching a first substrate 400 to the bonded semiconductor structure (100, 150, 200) and removal of the conductive material layer 210 according to the first embodiment of the present invention.

Referring to FIG. 7, the conductive material layer 210 is removed from the back surface of the dielectric handle substrate 200. A wet etch or a dry etch may be employed to remove the conductive material layer 210.

An array of first Controlled Collapse Chip Connection (C4) balls 450 are employed to bond the first exemplary bonded semiconductor structure (100, 150, 200, 210) with a first substrate 400. An array of first C4 pads 410 may be provided on the bottom surface of the first substrate 400. Each first C4 ball 450 in the array of the first C4 balls 450 vertically abuts a conductive surface on the semiconductor interposer structure and a first C4 pad 410. Each first C4 ball 450 has a diameter from 50 µm to 200 µm, and typically comprises a Sn—Ag—Cu alloy. The conductive surface may be a top surface of a conductive stud 22 or a conductive surface of one of the additional metal interconnect structures (not shown) formed in the at least one material layer 300.

The first substrate 400 may be a second semiconductor substrate including a plurality of semiconductor dies (not shown). Each semiconductor die, or each "semiconductor chip," may include a plurality of semiconductor devices. The first substrate 400 may have substantially the same area as the first exemplary bonded semiconductor structure (100, 150, 200, 210). For example, the semiconductor interposer structure 100 and the dielectric handle substrate 200 may be wafers having a diameter of 150 mm, 200 mm, or 300 mm, and the first substrate 400 may be a semiconductor wafer having a matching diameter as the semiconductor interposer structure 100 and the dielectric handle substrate 200. The assembly of the first substrate 400, the first C4 pads 410, the first C4 balls 450, and first exemplary bonded semiconductor structure (100, 150, 200, 210) is herein referred to as a first composite structure.

Figure 8:
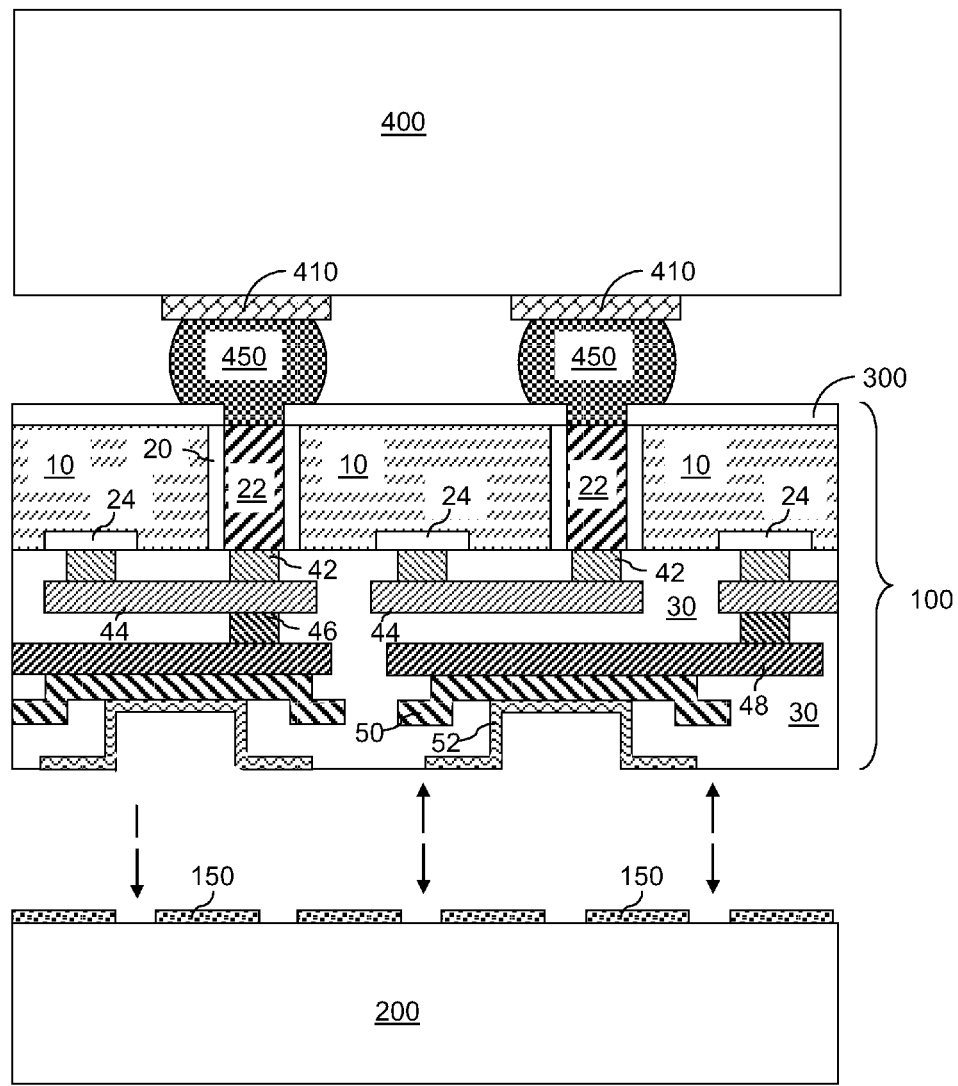
FIG. 8 is a vertical cross-sectional view of the first composite structure after ultraviolet irradiation and detachment of the dielectric handle substrate 200 from the semiconductor interposer structure 100 according to the first embodiment of the present invention.

Referring to FIG. 8, the adhesive layer 150 is irradiated with a deactivating radiation through the dielectric handle substrate 200. In case the adhesive layer 150 comprises an ultraviolet (UV) deactivatable material that has reduced adhesive strength upon exposure to ultraviolet radiation, the adhesive layer 150 is irradiated with ultraviolet radiation. In case the adhesive layer 150 comprises a optically deactivatable material that has reduced adhesive strength upon exposure to light in visible spectrum or in infrared range, the adhesive layer 150 is irradiated with light in visible spectrum or in infrared range. The dielectric handle substrate 200 and the adhesive layer 150 are detached from the semiconductor interposer structure 100. A suitable cleaning process may be performed on the back side of the semiconductor interposer structure 100 to remove residues of the adhesive layer 150.

The first composite structure comprises the semiconductor interposer structure 100, the first C4 balls 450, the first C4 pads 410, and the first substrate 400. The first composite structure may then be diced along dicing channels (not shown) located between the semiconductor dies in the first substrate 400.

Figure 9:
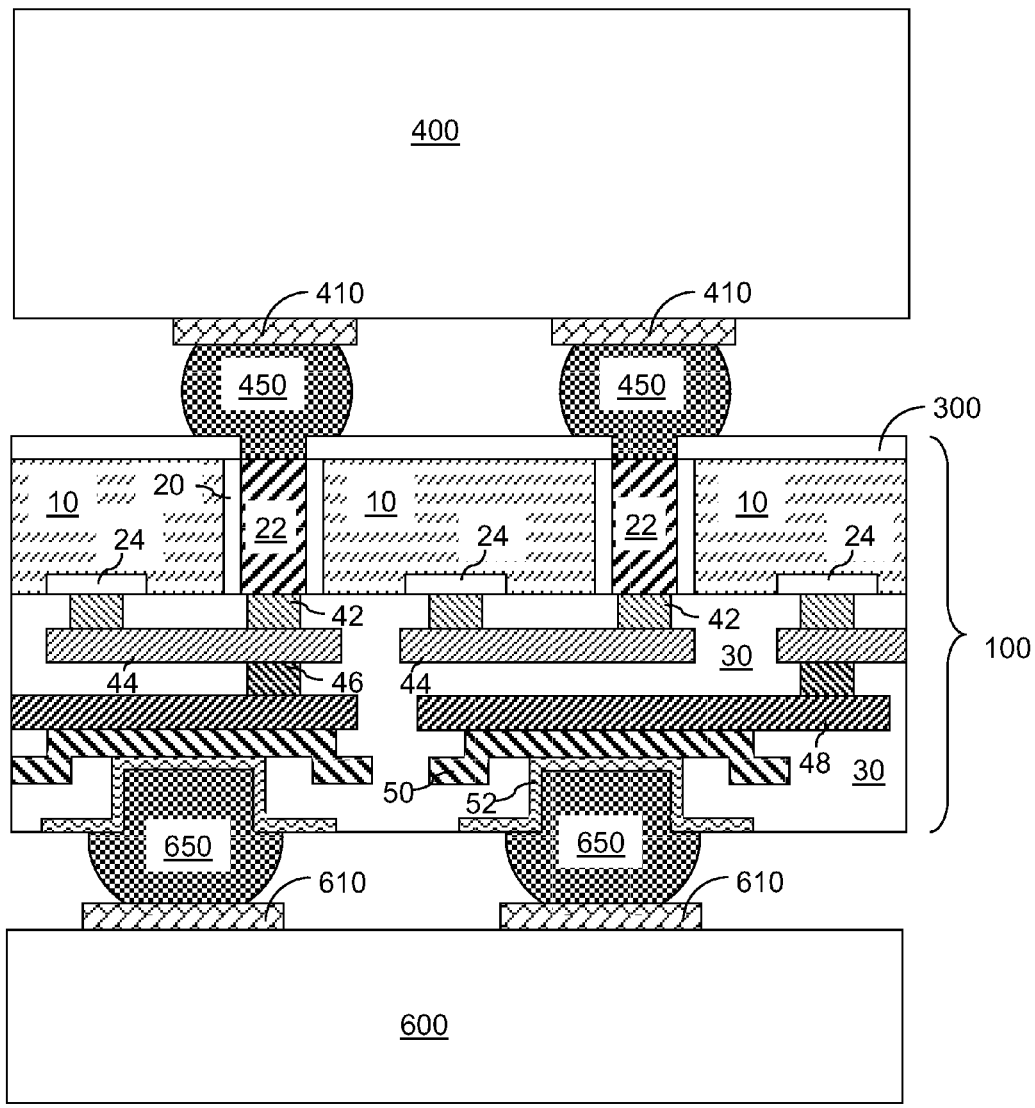
FIG. 9 is a vertical cross-sectional view of a second composite structure after attaching a second substrate 600 to the back of the semiconductor interposer structure 100 according to the first embodiment of the present invention.

Referring to FIG. 9, a second substrate 600 is attached to the back surface of the semiconductor interposer structure 100. The second substrate 600 may be a packaging substrate having second C4 pads 610. Second C4 balls 650 may be employed to bond the second substrate to the semiconductor interposer structure 100. Each second C4 ball 650 in the array of the second C4 balls 650 vertically abuts a first conductive pad 52 and a second C4 pad 610. Each second C4 ball 650 has a diameter from 50 µm to 200 µm, and typically comprises a Sn—Ag—Cu alloy.

Figure 10A:
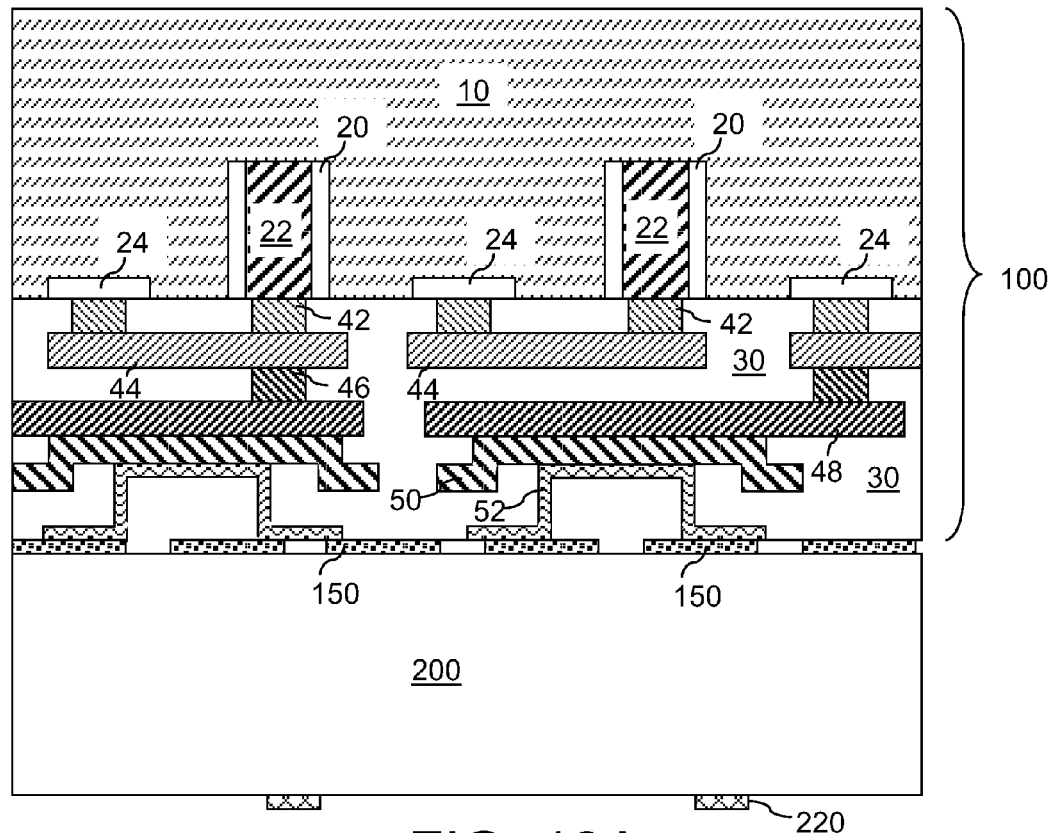
FIG. 10A is a vertical cross-sectional view of another bonded semiconductor structure in which a mesh of conductive wires 220 is patterned in a conductive material layer on the back surface of the dielectric handle substrate 200 according to a second embodiment of the present invention.
Figure 10B:
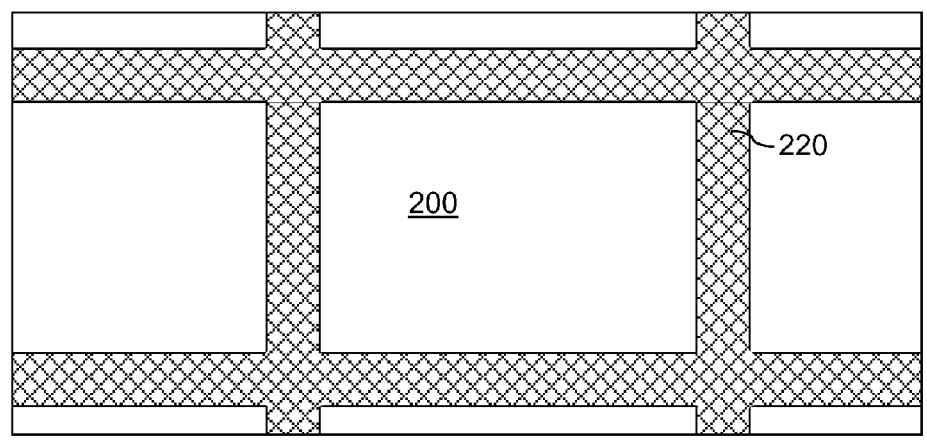
FIG. 10B is a bottom-up view of the other bonded semiconductor structure according to the second embodiment of the present invention.

Referring to FIGS. 10A and 10B, a second exemplary bonded semiconductor structure is shown. FIG. 10A is a vertical cross-sectional view and FIG. 10B is a bottom-up view. The second exemplary bonded semiconductor structure may be formed by patterning a mesh of conductive wires 220 in the conductive material layer 210. Formation of the mesh of conductive wires 220 may be effected by flipping the structure in FIG. 1 upside down and applying a photoresist (not shown) directly on the conductive material layer 210. The photoresist is patterned in the form of a mesh, and the pattern in the photoresist is subsequently transferred into the conductive material layer 210 by an etch so that the mesh of conductive wires 220 is formed directly on a surface of the dielectric handle substrate 200. The photoresist is employed as an etch mask during the etching process. An isotropic etch or an anisotropic etch may be employed for the etching process.

An adhesive layer 150 is applied to the surface of the dielectric handle substrate 200 located on an opposite side of the mesh of conductive wires 220. The dielectric handle substrate 200 is attached to a semiconductor interposer structure 100 in the same manner as in the first embodiment. During subsequent processing steps in which electrical bias is applied between the semiconductor interposer structure 100 and any component in a processing chamber, the mesh of conductive wires 220 may be employed to electrostatically chuck the second exemplary bonded semiconductor structure in the same manner as the electrostatic chucking of the first exemplary bonded semiconductor structure of the first embodiment.

Unlike the first embodiment, removal of the mesh of the conductive wires 220 is optional because the adhesive layer 150 may be irradiated without removing the mesh of the conductive wires 220. In other words, the processing step of removal of the conductive material layer 210 may be omitted in the second embodiment. The mesh of the conductive wires 220 is removed at the same time as the removal of the dielectric handle substrate 200.

Figure 11A:
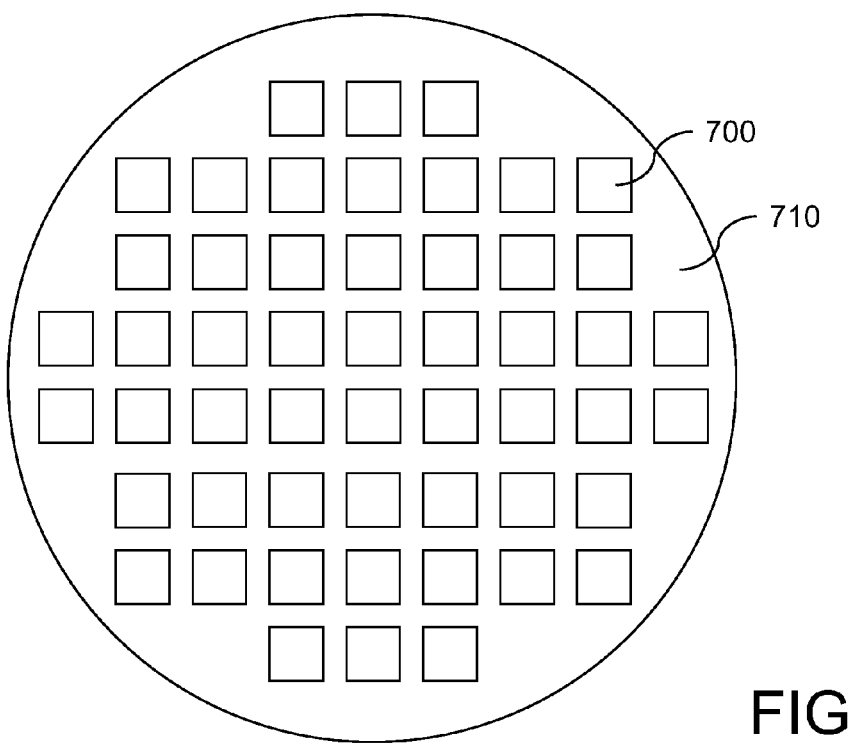
FIG. 11A is a bottom-up view of another semiconductor interposer structure 710 including semiconductor dies 700 according to a third embodiment of the present invention.
Figure 11B:
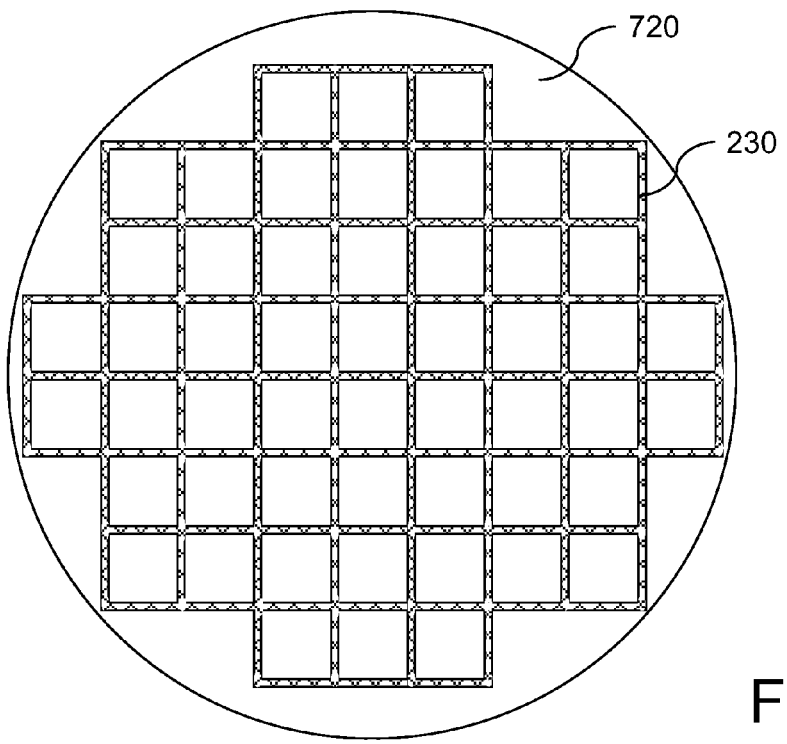
FIG. 11B is a bottom-up view of another dielectric handle substrate 720 according to the third embodiment of the present invention.

Referring to FIGS. 11A and 11B, exemplary structures according to a third embodiment of the present invention are shown. FIG. 11A is a bottom-up view of a semiconductor interposer structure 710 including semiconductor dies 700, and FIG. 11B is a bottom-up view of a dielectric handle substrate 720. The semiconductor interposer structure 710 includes semiconductor dies 700, each of which have an identical pattern to accommodate a semiconductor chip (not shown) in a first substrate 400 (See FIG. 7). Preferably, the semiconductor interposer structure 710 and the dielectric handle substrate 720 have the same diameter, e.g., 150 mm, 200 mm, or 300 mm. A mesh of conductive wires 230 is formed on the back surface of the dielectric handle substrate 720. The semiconductor interposer structure 710 includes an array of semiconductor dies 700 and dicing channels between the semiconductor dies 700. The dicing channels surround each of the semiconductor dies. Typically, the area of the dicing channels and the area of the semiconductor dies 700 complimentarily constitute the entirety of the patterned area in the semiconductor interposer structure 710. Typically, the semiconductor dies 700 are located in a rectangular array, and the dicing channels laterally abut and laterally surround each semiconductor die 700.

The area of for the mesh of the conductive wires 230 is selected so that the mesh of the conductive wires 230 underlies dicing channels between the semiconductor dies 700 in the semiconductor interposer structure 710 after bonding. Holes in the mesh of conductive wires 230 underlie a semiconductor die area in the semiconductor interposer structure 710. The mesh of conductive wires 230 on the dielectric handle substrate 720 may be formed in the same manner as in the second embodiment with the proviso that the area of the mesh of conductive wires 230 is selected to underlie the dicing channels in the semiconductor interposer structure 100.

An adhesive layer (not shown) may be applied to the front surface of the dielectric handle substrate 720 or the back surface of the semiconductor interposer structure 710. The front surface of the dielectric handle substrate 720 and the back surface of the semiconductor interposer structure 710 are brought together with the adhesive layer therebetween as in the first embodiment. A third exemplary bonded semiconductor structure (not shown) having a similar vertical cross-sectional view as the second exemplary bonded semiconductor structure of FIGS. 10A and 10B is formed. The difference between the third exemplary bonded semiconductor structure and the second exemplary bonded semiconductor structure is that the mesh of the conductive wires 230 underlies dicing channels between the semiconductor dies 700 in the semiconductor interposer structure 710. The holes in the mesh of the conductive wires 230 underlie a semiconductor die area, i.e., the area of a semiconductor die 700, in the semiconductor interposer structure 710.

The adhesive layer of the third embodiment may, or may not, comprise a deactivatable material. In other words, the adhesive layer of the third embodiment may comprise an ultraviolet deactivatable material, a visible-spectrum-deactivatable material, an infrared-deactivatable material, or an optically stable material that does not change adhesive strength upon exposure to radiation of ultraviolet light, visible light, and infrared radiation. The same processing steps may be employed for the rest of the processing sequence as in the second embodiment.

The entirety of the mesh of the conductive wires 230 may be removed during dicing of a stack of a semiconductor interposer structure and a dielectric handle substrate. Within each diced structure of a semiconductor interposer die and a dielectric handle die, no portion of the mesh of the conductive wires 230 is present. Thus, no other processing step is necessary for removal of the mesh of the conductive wires 230. Further, the semiconductor interposer die and the dielectric handle die within each diced structure separate naturally since no adhesive material is present between the semiconductor interposer die and the dielectric handle die. Thus, no processing step for deactivation of the material of the adhesive layer is needed. Moreover, any adhesive material, deactivatable or non-deactivatable, may be employed for the adhesive layer of the third embodiment of the present invention.

In addition to electrostatic chucking employing direct contact between an electrostatic chuck and a conductive material layer described above, the present invention further provides electrostatic chucking employing a capacitive coupling between an electrostatic chuck and a conductive material layer embedded in a substrate. In this case, electrostatic chucking is performed using either monopolar (single voltage polarity) or bipolar (positive and negative voltage polarity) electrostatic chucks. The charge on an electrostatic chuck is capacitively coupled to a dielectric substrate being chucked. Electrical charges of the opposite polarity are induced within a conductive material layer embedded or contacting the dielectric substrate even if the conductive material layer does not directly contact the electrostatic chuck. The charge build up on the chucked substrate can occur in the conductive material layer, which may be located on the surface of the dielectric substrate or embedded inside the insulating substrate.

Figure 12:
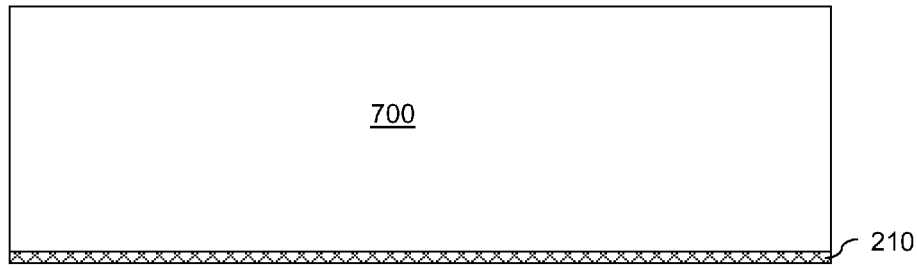
FIG. 12 is a vertical cross-sectional view of a dielectric handle substrate 700 having a conductive material layer 210 on a back surface according to a fourth embodiment of the present invention.

Referring to FIG. 12, a dielectric handle substrate 700 is provided according to a fourth embodiment of the present invention. The dielectric handle substrate 700 may comprise any dielectric material that may be employed for the dielectric handled substrate 200 of the first embodiment of the present invention as described above. A conductive material layer 210 is formed by depositing a conductive material on the bottom surface of the dielectric handle substrate 700. The conductive material layer 210 may have the same composition and thickness as in the first embodiment.

Figure 13:
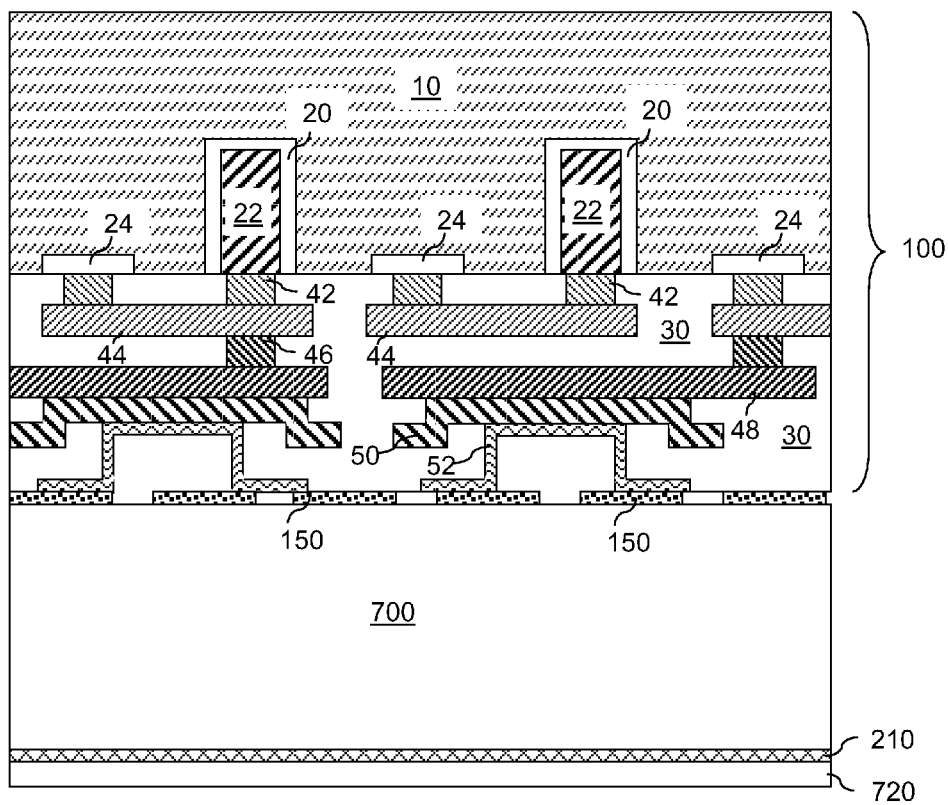
FIG. 13 is a vertical cross-sectional view of a bonded semiconductor structure including a semiconductor interposer structure 100, the dielectric handle substrate 700, and a dielectric surface layer 720 according to the fourth embodiment of the present invention.

Referring to FIG. 13, the dielectric handle substrate 700 is bonded to a semiconductor interposer structure 100 employing an adhesive layer 150 in the same manner as in the first embodiment. A dielectric surface layer 720 comprising a dielectric material is deposited on the bottom surface of the conductive material layer 210. The dielectric surface layer 720 comprises a dielectric material such as silicon oxide, silicon nitride, silicon oxynitride, aluminum oxide, a dielectric metal oxide, photosensitive polyimide, a polymer, or a combination thereof. The thickness of the dielectric surface layer 720 may be from 50 nm to 50 microns, although lesser and greater thicknesses are also contemplated herein.

Processing steps corresponding to FIGS. 3A, 3B, and 4-9 in the first embodiment may be performed on the fourth exemplary semiconductor structure. Particularly, the fourth exemplary semiconductor structure may be electrostatically chucked in a process chamber including an electrostatic chuck. As described above, induced charges are formed in the conductive material layer 210 in response to electrical charges that accumulate within the electrostatic chuck. Electrical charges on the electrostatic chuck induce electrical charges of the opposite polarity in the conductive material layer 210 located on the bottom surface of the dielectric handle substrate 700. Thus, the assembly of the semiconductor interposer structure 100, the adhesive layer 150, the dielectric handle substrate 700, the conductive material layer 210, and the dielectric surface layer 720 is electrostatically chucked to the electrostatic chuck in the processing chamber. The electrical coupling between the electrical charges in the electrostatic chuck and the electrical charges in the conductive material layer 210 is a capacitive coupling through the dielectric surface layer 720.

Figure 14:
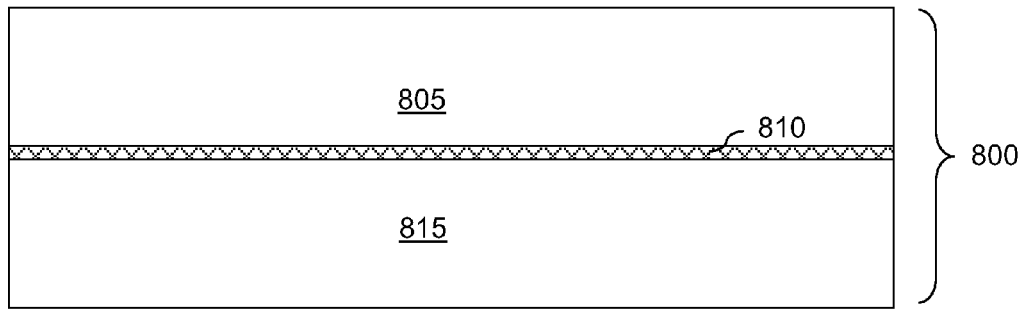
FIG. 14 is a vertical cross-sectional view of a handle substrate 800 including an upper dielectric handle substrate 805, an embedded conductive material layer 810, a lower dielectric handles substrate 815 according to a fifth embodiment of the present invention.

Referring to FIG. 14, a handle substrate 800 including an upper dielectric handle substrate 805, an embedded conductive material layer 210, a lower dielectric handles substrate 815 is provided according to a fifth embodiment of the present invention. Each of the upper dielectric handle substrate 805 and the lower dielectric handle substrate 815 includes a dielectric material, which may be any of the dielectric material that may be employed for the dielectric handle substrate 200 of the first embodiment of the present invention.

The handle substrate 800 includes an embedded conductive material layer 810, which comprises a conductive material such as doped semiconductor or a metallic material. The embedded conductive material layer 810 is formed between the upper dielectric handle substrate 805 and the lower dielectric handles substrate 815. For example, the embedded conductive material layer 810 may be formed on one of the upper dielectric handle substrate 805 and the lower dielectric handles substrate 815. The other of the upper dielectric handle substrate 805 and the lower dielectric handles substrate 815 may then be bonded to a surface of the embedded conductive material layer 810 to form the handle substrate 810. The embedded conductive material layer 810 may include the same material as the conductive material layer 210 of the first embodiment. The thickness of the embedded conductive material layer 810 may be from 10 nm to 50 microns, although lesser and greater thicknesses are also contemplated herein.

Referring to FIG. 13, the dielectric handle substrate 800 is bonded to a semiconductor interposer structure 100 employing an adhesive layer 150 in the same manner as in the first embodiment. In one case, a dielectric surface layer 720 comprising a dielectric material is deposited on the bottom surface of the handle substrate 800. The dielectric surface layer 720 comprises a dielectric material such as silicon oxide, silicon nitride, silicon oxynitride, aluminum oxide, a dielectric metal oxide, photosensitive polyimide, a polymer, or a combination thereof. The thickness of the dielectric surface layer 720 may be from 50 nm to 50 microns, although lesser and greater thicknesses are also contemplated herein. The dielectric surface layer 720 is optional. Formation of a dielectric surface layer 720 may be omitted in some other cases.

Figure 15:
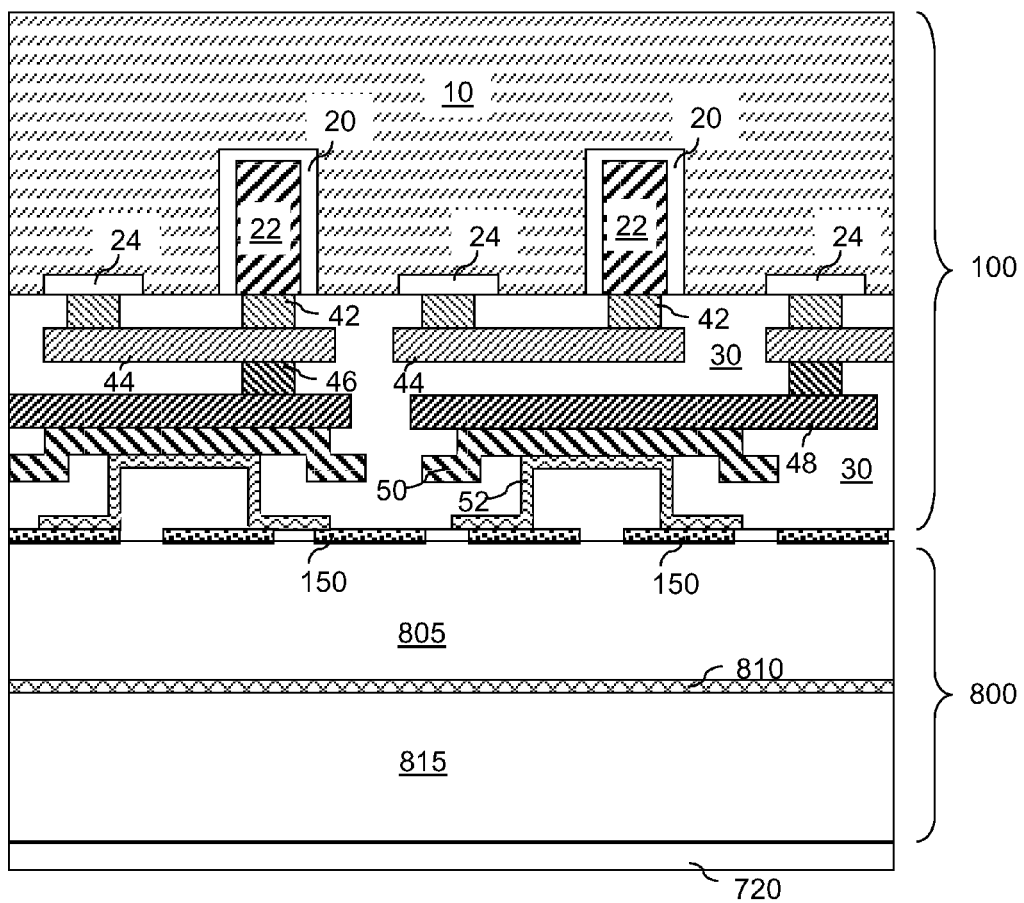
FIG. 15 is a vertical cross-sectional view of a bonded semiconductor structure including a semiconductor interposer structure 100, the handle substrate 800, and a dielectric surface layer 720 according to the fifth embodiment of the present invention.
Figure 15A:
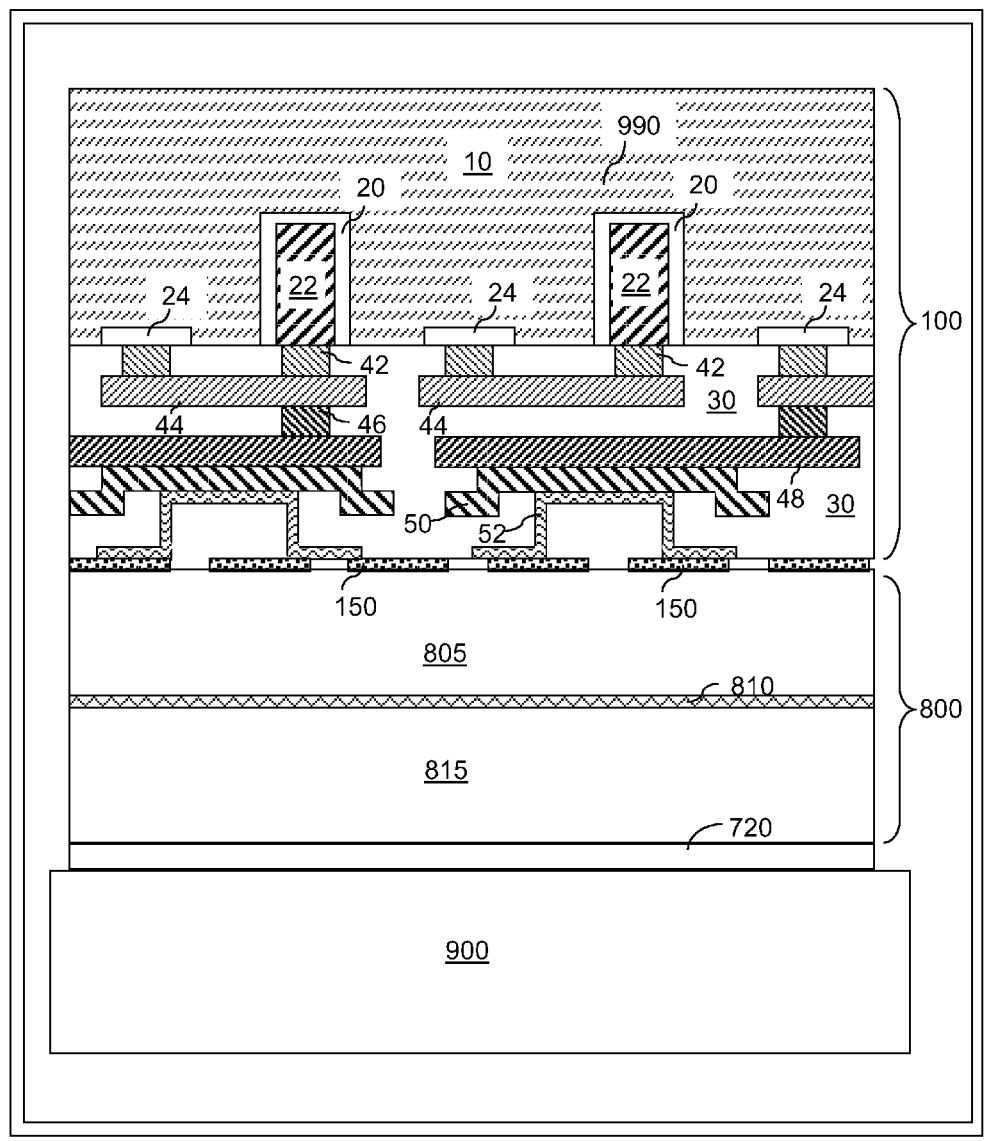
FIG. 15A is a vertical cross-sectional view of the bonded semiconductor structure of FIG. 15 as loaded onto an electrostatic chuck in a processing chamber.

Processing steps corresponding to FIGS. 3A, 3B, and 4-9 in the first embodiment may be performed on the fifth exemplary semiconductor structure. Particularly, the fifth exemplary semiconductor structure may be electrostatically chucked in a process chamber including an electrostatic chuck. As described above, induced charges are formed in the embedded conductive material layer 810 in response to electrical charges that accumulate within the electrostatic chuck. Electrical charges on the electrostatic chuck induce electrical charges of the opposite polarity in the embedded conductive material layer 810 within the handle substrate 800. Thus, the assembly of the semiconductor interposer structure 100, the adhesive layer 150, the upper dielectric handle substrate 805, the embedded conductive material layer 810, the lower dielectric handle substrate 815, and the optional dielectric surface layer 720 is electrostatically chucked to the electrostatic chuck 900 in the processing chamber 990 as illustrated in FIG. 15A. The electrical coupling between the electrical charges in the electrostatic chuck and the electrical charges in the embedded conductive material layer 810 is a capacitive coupling through the lower dielectric handle substrate 815 and the optional dielectric surface layer 720.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a bonded semiconductor structure including a dielectric handle substrate and a semiconductor interposer structure, wherein a front surface of said dielectric handle substrate is bonded to a back surface of a semiconductor interposer structure through an adhesive layer, wherein said semiconductor interposer structure includes metal interconnect structures electrically connected to first conductive pads located on said back surface of said semiconductor interposer structure, and wherein said adhesive layer abuts said front surface of said dielectric handle substrate and said back surface of said semiconductor interposer structure; and
   a first substrate bonded to a front side of said semiconductor interposer structure through an array of Controlled Collapse Chip Connection (C4) balls, wherein said semiconductor interposer structure comprises an array of conductive studs electrically connected to said metal interconnect structures and contacting said C4 balls.

2. The semiconductor structure of claim 1, wherein said semiconductor interposer structure includes a semiconductor substrate and at least one dielectric material layer that embeds said metal interconnect structures.

3. The semiconductor structure of claim 1, wherein said dielectric handle substrate comprises a material selected from a dielectric material selected from quartz, borosilicate glass, amorphous silicon oxide, aluminum oxide, and a transition metal oxide having a wide band gap to allow transmission of ultraviolet radiation.

4. The semiconductor structure of claim 1, wherein said array of conductive studs extends through a semiconductor substrate within said semiconductor interposer structure.

5. The semiconductor structure of claim 1, wherein said semiconductor interposer structure includes a first semiconductor substrate, said first substrate is a second semiconductor substrate includes a plurality of semiconductor dies, and wherein each semiconductor die among said plurality of semiconductor dies includes a plurality of semiconductor devices.

6. A semiconductor structure comprising:
a bonded semiconductor structure including a dielectric handle substrate and a semiconductor interposer structure, wherein a front surface of said dielectric handle substrate is bonded to a back surface of a semiconductor interposer structure through an adhesive layer, wherein said semiconductor interposer structure includes metal interconnect structures electrically connected to first conductive pads located on said back surface of said semiconductor interposer structure, and wherein said adhesive layer abuts said front surface of said dielectric handle substrate and said back surface of said semiconductor interposer structure; and
a conductive material layer located underneath a back surface of a dielectric handle substrate.

7. The semiconductor structure of claim 6, wherein said conductive material layer contacts said back surface of said dielectric handle substrate.

8. The semiconductor structure of claim 7, wherein a bottom surface of said conductive material layer is physically exposed.

9. The semiconductor structure of claim 7, wherein said conductive material layer comprises a mesh of conductive wires.

10. The semiconductor structure of claim 7, further comprising another dielectric handle substrate contacting a bottom surface of said conductive material layer and comprising a dielectric material selected from quartz, borosilicate glass, amorphous silicon oxide, aluminum oxide, and a transition metal oxide having a wide band gap to allow transmission of ultraviolet radiation.

11. The semiconductor structure of claim 7, further comprising a dielectric surface layer contacting a bottom surface of said conductive material layer and comprising a dielectric material selected from silicon oxide, silicon nitride, silicon oxynitride, aluminum oxide, a dielectric metal oxide, photosensitive polyimide, a polymer, and a combination thereof.

12. A semiconductor structure comprising:
a bonded semiconductor structure including a dielectric handle substrate and a semiconductor interposer structure, wherein a front surface of said dielectric handle substrate is bonded to a back surface of a semiconductor interposer structure through an adhesive layer, wherein said semiconductor interposer structure includes metal interconnect structures electrically connected to first conductive pads located on said back surface of said semiconductor interposer structure, and wherein said adhesive layer abuts said front surface of said dielectric handle substrate and said back surface of said semiconductor interposer structure, wherein said adhesive layer comprises a deactivatable adhesive material which provides adhesive strength prior to deactivation but substantially loses adhesive property upon deactivation.

13. The semiconductor structure of claim 12, wherein said adhesive layer comprises an ultraviolet (UV) deactivatable material having reduced adhesion strength upon exposure to ultraviolet radiation.

14. The semiconductor structure of claim 12, wherein said adhesive layer comprises an oligomer that loses cross-linkage upon exposure to ultraviolet (UV) light.

15. The semiconductor structure of claim 12, wherein said adhesive layer comprises an acrylic adhesive material that deactivates and significantly loses adhesive property upon exposure to ultraviolet light.

16. The semiconductor structure of claim 12, wherein said adhesive layer is a single contiguous layer.

17. The semiconductor structure of claim 12, wherein said adhesive layer is a plurality of disjoined adhesive material portions.

18. A semiconductor structure comprising:
a bonded semiconductor structure including a dielectric handle substrate and a semiconductor interposer structure, wherein a front surface of said dielectric handle substrate is bonded to a back surface of a semiconductor interposer structure through an adhesive layer, wherein said semiconductor interposer structure includes metal interconnect structures electrically connected to first conductive pads located on said back surface of said semiconductor interposer structure, and wherein said adhesive layer abuts said front surface of said dielectric handle substrate and said back surface of said semiconductor interposer structure, wherein said semiconductor interposer structure comprises an array of conductive studs electrically connected to said metal interconnect structures and embedded in a semiconductor substrate within said semiconductor interposer structure, wherein topmost surfaces of said array of conductive studs contacts a semiconductor material within said semiconductor substrate.

* * * * *